United States Patent [19]

Bernecker et al.

[11] Patent Number: 5,508,886
[45] Date of Patent: Apr. 16, 1996

[54] ELECTRICAL SYSTEM CONSISTING OF INDIVIDUAL SUBASSEMBLIES

[76] Inventors: Erwin Bernecker, Mitterndorf 70, A-5122 Ach; Josef Rainer, Holzöster 16, A-5131 Franking, both of Austria

[21] Appl. No.: 162,166
[22] PCT Filed: Jun. 10, 1992
[86] PCT No.: PCT/AT92/00074
  § 371 Date: Apr. 21, 1994
  § 102(e) Date: Apr. 21, 1994
[87] PCT Pub. No.: WO92/22997
  PCT Pub. Date: Dec. 23, 1992

[30] Foreign Application Priority Data

Jun. 11, 1991 [AT] Austria ................. 1170/91

[51] Int. Cl.⁶ .............. H05K 5/02; H05K 7/14; H05K 7/18; H05K 7/10
[52] U.S. Cl. .......... 361/733; 361/728; 361/725; 361/732; 361/807; 361/809; 361/810; 439/928; 439/928.1
[58] Field of Search ............ 174/52.1; 211/41; 312/9.1, 223.1; 206/387, 334, 328; 361/753, 755, 756, 796, 797, 807, 802, 809, 810, 825, 829, 729–733, 740, 759, 754, 798, 801; 439/64, 341, 61, 928, 928.1, 152, 153, 155, 157, 328, 327, 331, 345

[56] References Cited

U.S. PATENT DOCUMENTS

| | | | |
|---|---|---|---|
| 4,152,750 | 5/1979 | Bremenour et al. | 361/796 |
| 4,632,594 | 12/1986 | Del Tufo et al. | 403/322 |
| 4,790,762 | 12/1988 | Harms et al. | 439/59 |
| 4,956,747 | 9/1990 | Beer et al. | 439/928 |
| 4,972,296 | 11/1990 | Chu | 361/736 |
| 4,991,056 | 2/1991 | Shimizu et al. | 361/740 |
| 5,181,168 | 1/1993 | Seitz et al. | 361/802 |
| 5,249,579 | 10/1993 | Deinhardt et al. | 439/341 |

FOREIGN PATENT DOCUMENTS

| | | | |
|---|---|---|---|
| 0236711 | 9/1987 | European Pat. Off. . | |
| 515797 | 12/1992 | European Pat. Off. | 361/729 |
| 542594 | 5/1993 | European Pat. Off. | 361/802 |
| 1150711 | 6/1963 | Germany | 361/796 |
| 2324755 | 11/1973 | Germany | 439/64 |
| 2748100 | 5/1979 | Germany | 361/796 |
| 8415458.6 | 3/1986 | Germany . | |
| 8626971.2 | 1/1987 | Germany . | |
| 3629566 | 3/1988 | Germany | 361/732 |
| 271606 | 9/1989 | Germany | 361/802 |
| 8910111.1 | 11/1989 | Germany . | |
| 4225573 | 2/1993 | Germany | 361/756 |
| 892185 | 3/1962 | United Kingdom | 361/796 |

Primary Examiner—Donald A. Sparks
Attorney, Agent, or Firm—Collard & Roe

[57] ABSTRACT

In an electrical system consisting of individual subassemblies, particularly in a control system composed of modules, the individual subassemblies (1, 2) comprise housings, which are adapted to be arranged in a row and for making electric line connections are provided with plug terminals for counterplug terminals on a subassembly carrier. The housings (1, 2) are secured to the subassembly carrier (4) by detachable retaining elements (27, 30, 34), particularly by swivel holders which permit the housings to be swung up, and by snap holders (27, 28) for locking the housings when they have been swung into the row. To permit a manufacture from a few basic elements, which are to be arranged in a row of any desired length, the subassembly carrier consists of rear wall elements (4), which are adapted to secured to a profiled carrying rail (5) so that the rear wall elements (4) are arranged in a row, and the rear wall elements hold the counterplug terminals (41, 42) and have holder and counterholder parts (27, 30) for the housings (1, 2). Their widths match the module dimensions of the housings.

10 Claims, 6 Drawing Sheets

5,508,886

ELECTRICAL SYSTEM CONSISTING OF INDIVIDUAL SUBASSEMBLIES

CROSS-REFERENCE TO RELATED APPLICATIONS

This is an application filed under 35 U. S. C. 371 of PCT/AT92/00074.

BACKGROUND OF THE INVENTION

1. Field of the Invention

This invention relates to an electrical system consisting of individual subassemblies, particularly to a control system which is composed of modules, wherein the individual subassemblies comprise housings, which are adapted to be arranged in a row and are provided with plug terminals for counterplug terminals on a subassembly carrier for making electrical line connections. The housings are secured to the subassembly carrier by detachable retaining means, particularly by swivel holders which permit the housings to be swung up, and by snap holders for locking the housings when they have been swung into the row.

The design of an electrical system composed of individual subassemblies permits systems which differ in size or serve different purposes to be assembled from subassemblies which are identical or similar at least in appearance and in dependence on the size of the system and the space which is available it is possible to superimpose a plurality of rows of subassemblies and the line connections between the rows may then be effected by interposed busbars or cables.

2. Description of the Prior Art

DE-U1-84 15 458 discloses a system of the kind described first hereinbefore. In that known system the subassembly carrier consists of a profiled rear wall plate, which extends over the height of the housings of the subassemblies and extends continuously throughout the length of the row, and the housing of each subassembly can be secured to said plate. The housings are preferably provided at the bottom with hooks, which are swung into profiled troughs formed in the rear wall, and the housings are secured at the top by separate retaining members, which separate adjacent subassemblies and are mounted on retaining rails which are integral with and protrude from the carrying plate. The electric supply lines, ground lines and preferably also the data lines consist of lines which extend throughout the length of the plate and near the terminals of the several subassemblies are provided with counterplug assemblies for plug terminals which protrude from the subassemblies. In control systems the data lines preferably consist of so-called bus lines.

The known design has the disadvantage that the plug terminals must be mounted on the subassembly carrier in accordance with the subassemblies which may differ in width and the sequence of the subassembly carriers which differ in width must be determined in advance. Besides, the continuous rear wall plate is an expensive part, which must be cut or made in dependence on the length which is required for the row. Finally, subassemblies differing in width will require the making of separate housings, which differ in width and fit the subassemblies. Even housings having the same width may differ in their basic structure in dependence on the intended use of each housing. For this reason it will be necessary for the manufacture only of the subassembly carrier and of the subassembly housings for such system to provide a large number of different molds for making the subassembly carriers and housings, which in most cases are made of plastic. Besides, any extension or alteration of an existing system will require the overall design to be altered and will require in most cases an alteration of the baseplate which constitutes the subassembly carrier and of the wiring and plug arrangement on such plate and will require a removal of all or at least most of the existing subassemblies. For this reason such alterations or extensions will take a long time and will require the entire system to be shut down for a correspondingly long time. A replacement of individual subassemblies for repairs or alterations will not be possible unless an exactly fitting replacement part for said subassemblies is available.

In other known systems, such as are known from DE-U1-86 26 971, the individual subassemblies are accommodated in closed housings, which by means of a snap lock on their rear side can be mounted on a profiled carrying rail, such as a hat profile rail, so that the housings are juxtaposed in a row. In that case housings which differ in width may be assembled in rows having any desired length. A disadvantage resides in that an electric line connection to system parts accommodated in the housings will normally have to be made by means of cables extending from housing to housing so that a permanent wiring will be required and a replacement of individual elements or subassemblies will require a shutdown of the system and a higher assembling expenditure.

SUMMARY OF THE INVENTION

It is an object of the invention to provide a system which is of the kind described first hereinbefore and in which the advantages of the known systems are combined but which is free of their disadvantages so that it permits, on the one hand, even subassemblies which differ in width to be arranged in a row in any desired sequence and facilitates the replacement of the individual subassemblies and, on the other hand, permits the use of simple carrying elements for the individual rows of subassemblies of the system and permits the making of housings even in different widths from a few basic elements.

The invention resides essentially in that the subassembly carrier consists of rear wall elements, which are adapted to be secured to a profiled carrying rail so that said rear wall elements are arranged in a row, and said rear wall elements are provided with means for holding the counterplug terminals and with holder and counterholder parts for the housings and have widths which match the module dimensions of the housings.

The invention permits an electrical system to be designed like the known system which has a subassembly carrier consisting of a continuous plate but because that subassembly carrier consists of individual rear wall elements there is no need for making special parts but the subassembly carrier is simply assembled from a corresponding number of rear wall elements, in which the functions of making the electric line connections and holding or providing the elements for securing the housings of the individual subassemblies are also integrated. The carrying function and the aligning function are partly performed by the carrying rail, which may consist of a commercially available profiled rail.

It is conceivable and possible to use rear wall elements which differ in width and have a width which is an integral multiple of the basic module dimension and in that case said rear wall elements have a width which is adapted to subassemblies which differ in width and to the corresponding housings. But in that case the sequence of the housings which differ in width in the row will be determined by the rear wall elements unless rear wall elements are employed which although they differ in width are provided adjacent to each module base width with identical profiled portions, receptacles for the holders, etc., so that two or more narrower housings can be secured in juxtaposition to such a rear wall element. But in a more desirable embodiment, which has a more universal utility, the housings have different widths, which are an integral multiple of a basic module dimension, and the rear wall elements have identical widths, which correspond to the basic module dimension, i.e., the smallest housing width, so that rear wall elements in a number depending on the housing width are associated with each housing but the sequence of the housings can be selected and altered as desired. Extensions and alterations or re-organizations of the system will then also be simplified.

According to a further feature the rear wall elements consist of shaped articles which are integrally formed with extensions and mating recesses for making aligned plug-and-socket joints to adjacent rear wall elements in the row and are integrally formed with retaining extensions for the housings or for snap-locking means which are adapted to snap into said retaining extensions and serve to lock the housings. The plug-and-socket joints will permit an exact alignment of adjacent rear wall elements and will impart a higher stability to the entire rear wall composed of the elements.

For joining rear wall elements to adjacent rear wall elements, spring clips, which protrude through lateral openings from the elements and are adapted to snap into the one element, and associated openings for receiving the retaining legs of the spring clips of the adjacent element are provided. Adjacent rear wall elements are held in contact with each other by said clips. In a preferred embodiment the spring clips have spring legs, which are adapted to be disengaged by an actuation from the front side of the rear wall element and which just as the rear wall elements themselves consist of plastic moldings so that there is no need for metal parts which would be susceptible to corrosion or owing to their conductivity would disturb the electrical system and it will be possible to make and separate the connection between adjacent rear wall elements also from the front side when the rear side is not accessible.

According to a desirable further feature the carrying rail consists of a hat profile rail and each rear wall element is provided on the rear side with a recess for receiving said rail and with hooks or flanges for one flange of the rail whereas pivoted catches for the second flange of the rail are mounted on the rear wall elements and when the elements have been hung into the rails are pivotally movable to a locking position, in which they engage the top of the flange with a wedge surface to clamp the flange in position. Said fixation is not only very simple but affords also the decisive advantage that hanging in and hanging out can easily be effected and the pivoted catches in an intermediate position can engage the associated rail flange at its top to hold the rear wall element on the rail but still permit the rear wall element to be displaced on the rail before the rear wall element is finally locked in the desired final position in that the pivoted catch is tightened.

An actuating handle which protrudes to one side over the width of the rear wall element may be provided for the pivoted catch which is mounted on the rear side of the rear wall element and the position of said handle will be visible also from the front side and for the rear wall element which is being mounted at the end of the row at a given time will indicate whether or not the pivoted catch has been tightened. In that case the handle may be colored in a signal color, which contrasts with the housing or the rear wall.

According to a further feature the pivoted catch is provided with a pivot, which extends to the front side of the rear wall element, so that the position of the pivoted catch can also be detected from the front side of the rear wall element when the housing of a subassembly has been removed.

According to a preferred further feature the position indicator is a disk, which has a receiving opening or extensions for an actuating implement or a coin so that the pivoted catch can be actuated from the front side of the rear wall element. In that case it is possible in case of need to loosen the pivoted catches in a row of rear wall elements from a certain rear wall element to one end of the row so that the row can be shifted on the rail and a new rear wall element can be inserted or, when a rear wall element has been removed, the row can again be closed.

According to a preferred feature the counterplug terminals for the plug terminals of the subassembly are mounted on a carrier, which is detachably secured to the rear wall element. This will afford the advantage that counterplug terminals fitting each subassembly can properly be mounted without a need for alterations at the rear wall element itself. Particularly if the subassemblies and housings are relatively wide it is often appropriate to provide plug terminals only in the edge portions of the subassembly.

In accordance with the invention the counterplug terminals for the contact terminals of the subassemblies are provided on one side with plug terminals and on the other side of the rear wall element with counterplug terminals, which are mounted there and serve to cooperate with the plug terminals and counterplug terminals of adjacent rear wall elements. This will have the result that the contact connections for electric lines, such as supply lines, control lines, ground lines, and a data bus can be made simply in that adjacent rear wall elements are pushed against each other so that such lines will automatically be extended if additional rear wall elements are included in the row and additional wiring operations will not be required in the row.

The plug and counterplug terminals for the subassemblies and the adjacent rear wall elements are desirably combined in double plug elements.

To permit also the housings of the individual subassemblies to be assembled from only a few basic elements, each housing comprises two shell halves, which in case of the smallest module width supplement each other to form a housing and between which interposed pieces having a width which is an integral multiple of the basic module dimension are disposed to adjoin the shell walls in case of larger module widths.

It is apparent that two identical shell members will be required for the basic structure of a housing and that they may be supplemented by interposed pieces having different widths. All said parts can be made in a relatively simple manner and an adaptation to various applications will nevertheless be permitted. Such additional elements may also be used to change the appearance of the front side of the subassemblies and of the system composed of said subassemblies in accordance with the requirements or for esthetic reasons.

If heat-sensitive elements which generate heat in operation are accommodated in the subassemblies, the housings may be formed with cooling openings in their shell so that the required temperatures can be maintained.

It has already been mentioned that the basic housings can be adapted to the intended use and their overall appearance can be altered by the provision of different make-up parts. According to a possible feature the housings may be provided in their front side with window openings in accordance with the base module pitch, which openings serve to selectively receive hinged or sliding doors and/or insertable shutter elements. The arrangement in the base module pitch is also chosen so that a uniform pitch in the module width will be maintained in the row on the visible side.

Pivoted and snap catches for the doors and for sight and display windows provided in addition to the doors may be integrally formed with the corresponding edges of the shell members or interposed pieces. Besides, the sells and/or interposed pieces may be provided with ribs protruding into the interior of the housings or with extensions for retaining built-in element and/or are integrally formed with slide tracks for printed circuit boards, computer modules, and display means and for smaller module housings which receive separate subassemblies so that the individual subassemblies can be extended in that the elements forming them are fitted together and inserted.

Further details and advantages of the subject matter of the invention will become apparent from the following description of the drawing.

BRIEF DESCRIPTION OF THE DRAWING

The subject matter of the invention is illustrated by way of example in the drawing, in which.

DESCRIPTION OF THE PREFERRED EMBODIMENTS

Figure 1:
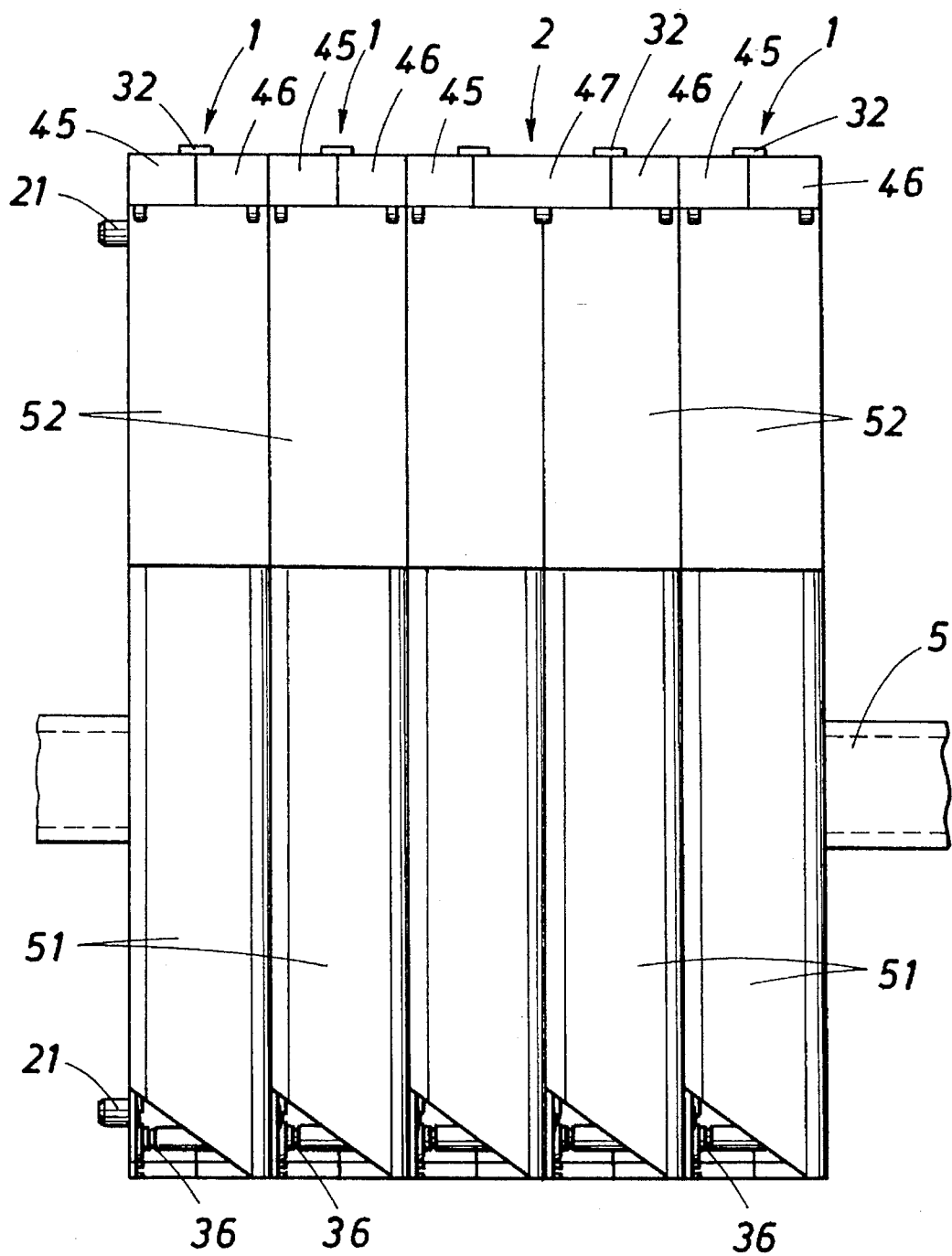
FIG. 1 is a front elevation showing a part of an electrical system consisting of four subassemblies.
Figure 2:
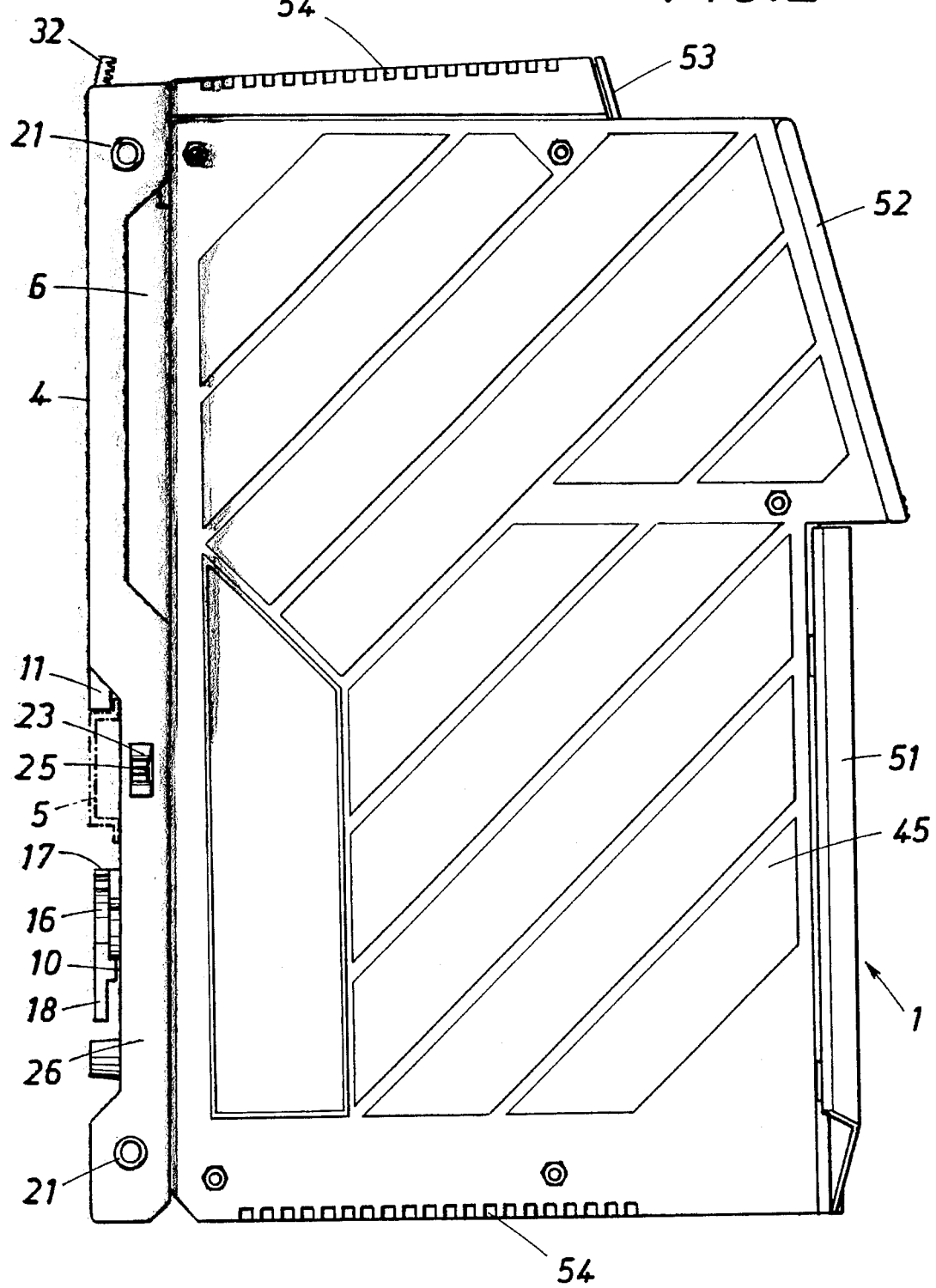
FIG. 2 is a side elevation showing the housing of one subassembly in a position in which the housing is mounted on a rear wall element; the carrying rail is represented only by its contour.

FIG. 1 shows a part of an electrical system, which part is composed of a plurality of subassemblies 1, 2. The subassemblies 1 have the same width and have the same design when viewed from the outside. The width of the subassemblies 2 is twice the width of the subassemblies 1. As shown in Fig. 2, the subassemblies are mounted to be juxtaposed in a row by means of rear wall elements 4, which have the same width as the subassemblies 1. The rear wall elements 4 are mounted on a carrying rail 5, which has a hat profile.

Figure 8:
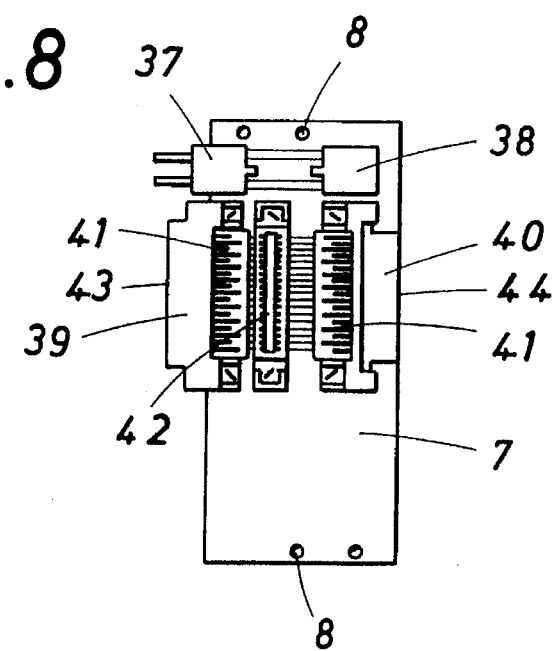
FIG. 8 is a schematic representation of a carrier, which is to be secured to the rear wall element and provided with plug terminals.

Each rear wall element 4 consists of a plastic molding and has in its top portion on its front side a recess 6. As is particularly apparent from FIG. 6, forwardly facing stiffening ribs are provided at the recess 6 in order to save weight. Said ribs can serve as a support for a carrying plate 7, which is shown in FIG. 8 and is secured by fixing screws, which are inserted through openings 8 and extend into corresponding sleeve elements 9 in the front side of the rear wall elements 4.

Figure 3:
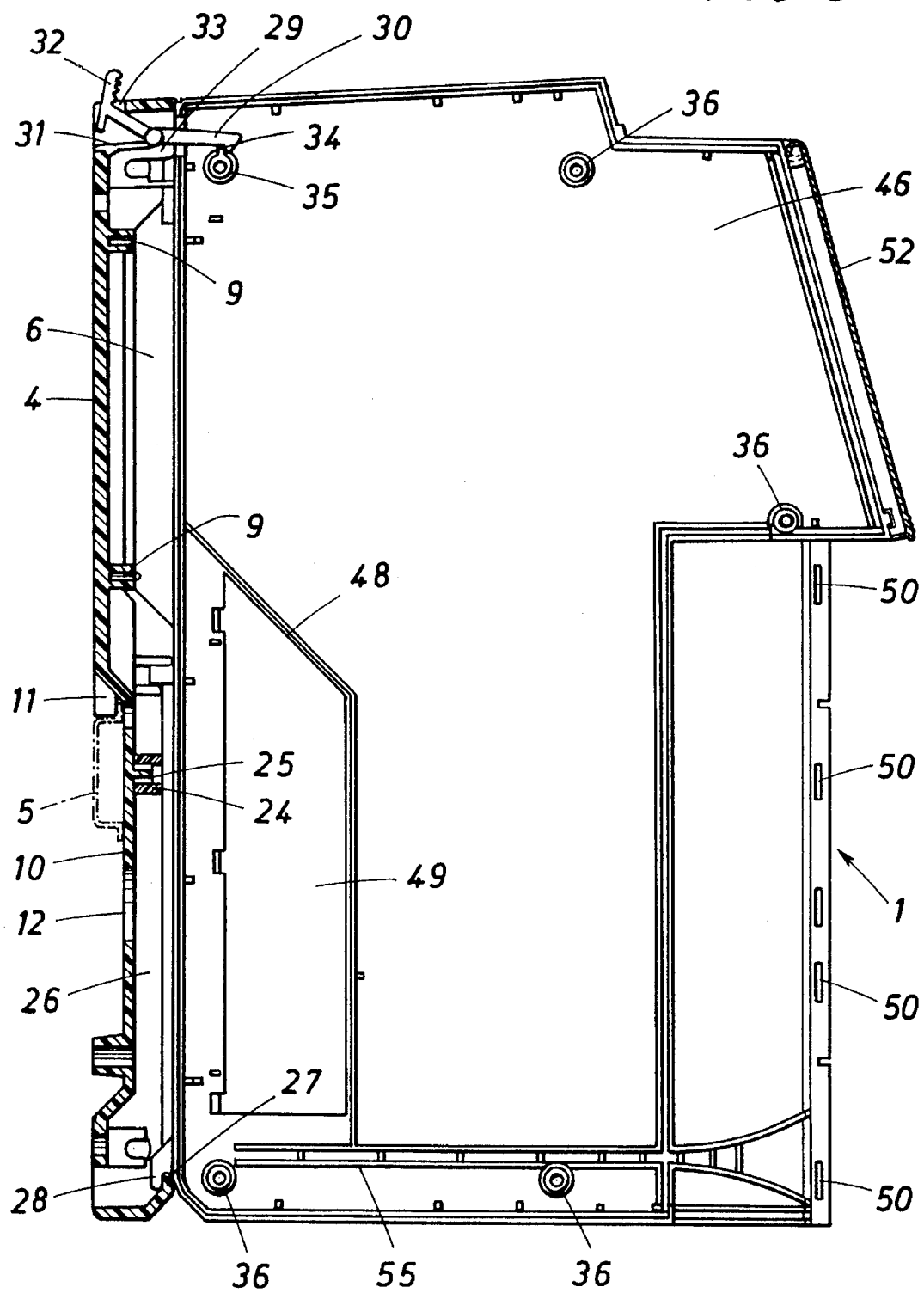
FIG. 3 is a corresponding longitudinal sectional view showing the housing.
Figures 4, 5, 6:
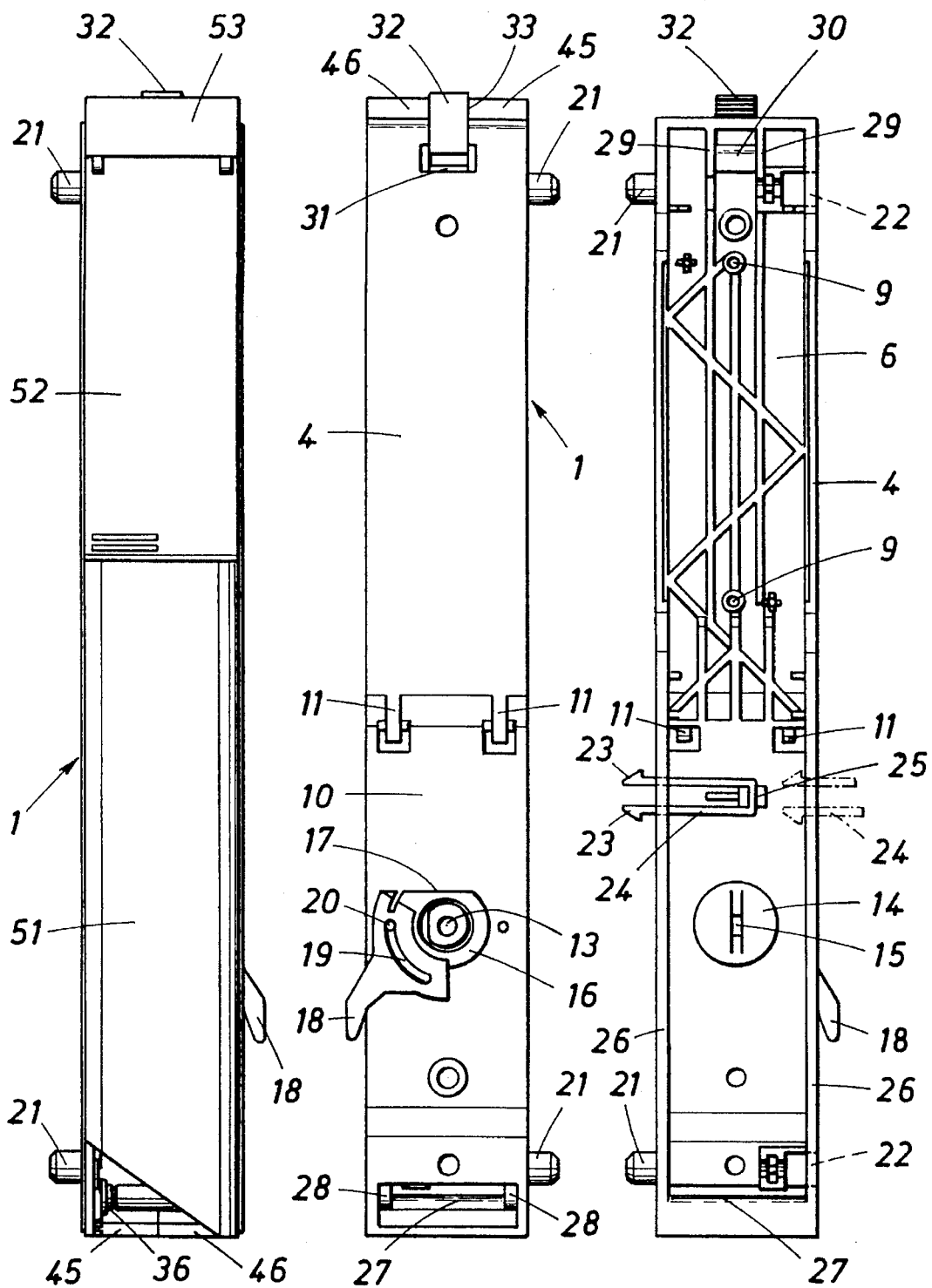
FIG. 4 is a front elevation related to FIG. 2.
FIG. 5 is a rear elevation related to FIG. 2.
FIG. 6 is a side elevation showing the rear wall element.

The rear wall element is provided also in its bottom portion with a recess 10, which in that case extends from the rear side and from which hooks or extensions 11 for engaging the top flange of the rail 5 protrude. An opening 12 (see FIGS. 3 and 9) receives a pivot 13, to which a disk 14 is secured on the front side of the rear wall element 4 (FIGS. 5 and 6). The disk 14 is formed with a slot 15, which is adapted to receive coin or another turning implement and serves also as a position indicator. In the recess 10 provided on the rear side of the rear wall element the pivot 13 carries a pivoted catch 16, which has the configuration of a circle which is cut off on one side along a straight line 17. The catch 16 can be rotated by means of a handle 18, which protrudes from the rear wall element on one side and preferably has a signal color. Like a wobble plate or wedge plate the pivoted catch 16 is provided with a wedge surface on that side which faces the rear wall of the recess 10 and in the position shown in FIG. 5 permits the rear wall element 4 to be hung on carrying rail 5. The lever 18 can be swung up to move the wedge face of the catch 16 into engagement with the bottom flange of rail 5 so that the rail will be clamped against the rear wall 10 when the lever 18 has reached its final position, which is defined by a slot 19 and a stop pin 20.

As shown in FIG. 6, rear wall elements 4 are provided at their top and bottom with pinlike connecting members 21, which protrude on one side, and are provided on the other side with mating recesses 22 for receiving the connecting members 21 of the adjacent rear wall elements. When the rear wall elements have entirely been pushed together, hooklike extensions 23 of a spring clip 24 engage the rear side of corresponding holes in the other side edge of the adjacent rear wall elements to clamp two adjacent rear wall elements 4 together. The spring clip 24 has a crosspiece, which engages a detent recess on the front side of the rear wall element, and spring legs, which extend out through lateral openings in raised side edges 26 of the bottom portion of the rear wall element. Because the spring legs 24 are freely accessible over the rear surface of the rear wall element beside the raised side edges 26 said snap lock can be eliminated in that the legs 24 are forced together when the housing has been removed.

A cross-web 27 is raised in the lowermost portion of the rear wall element 4 between the side edges 26 and in a manner which will be described hereinafter serves s a pivot bearing for fixing hooks 28 provided on the housings 1, 2. A guide for a pivoted hook 30 is formed in the uppermost portion of the rear wall element between side webs 29. As shown in FIG. 3, pivoted hook 30 is integrally formed with a spring leg 51, which is supported in a rear wall opening. The pivoted hook 30 is provided with a handle which serves also to retain that pivoted book in a mating opening 33. The hook 30 can be swung up by pushing the handle 32 back toward the spring leg 31. The parts 27 and 30 together constitute the main holder for the housings 1 and 2. The hook 30 snaps onto a detent rib 34 of a continuous housing sleeve 35. Further housing sleeves 36 serve to receive fixing screws, which extend from side wall to side wall of the housing 1 or 2 and hold the housing parts together.

As shown in FIG. 8, a double plug 37 on one side and a double plug socket 38 on the other side of the carrying plate 7 are provided at its top and serve to provide continuous connecting lines for power and as a ground line and will automatically engage corresponding plugs and sockets of the adjacent rear wall elements 4 when the rear wall elements 4 are plugged together. Multiple double plugs 39, 40 are mounted below said elements and have multiple plug tongues 41, 42, which are directed toward the front side, and multiple plugs and plug terminals 43, 44, which are directed to the left and right, respectively, and cooperate with the corresponding counterterminals of the adjacent rear wall elements 4. The multiple plugs 41, 42 cooperate with corresponding multiple plugs and counterplugs of printed circuit boards and of corresponding elements accommodated in the housings 1, 2 and will automatically be moved into engagement as the housings 1 and 2 are attached to the rear wall elements. The double plugs 37 and plug sockets 38 for the power line and ground line may be integrated in the multiple double plugs 39, 40 in a modified embodiment.

Each housing 1 consists of two shell halves 45, 46 (FIG. 1), which are mirror images of each other. The housing 2 is composed of two such shell halves 45, 46 and an interposed piece 47, which has the same width as a rear wall element 4 and adjoins the shell edges of the two shell elements 45, 46 and comprises sleeves, which correspond to the sleeves 35, 36 and are secured to partition carriers, and is held together with the shell members by screws, which extend through the sleeves. The shell members and the interposed pieces have edge profiles which are mirror images of each other. Through openings for receiving the counterplugs (not shown) and the hooks 30 passing through are provided on that side which faces the rear wall elements. The housings 1, 2 are secured to the rear wall elements by hanging the hooks 28 on cross-web 27, and the housings are then swung up until the hooks 30 snap into the detent ribs 34.

Figure 7:
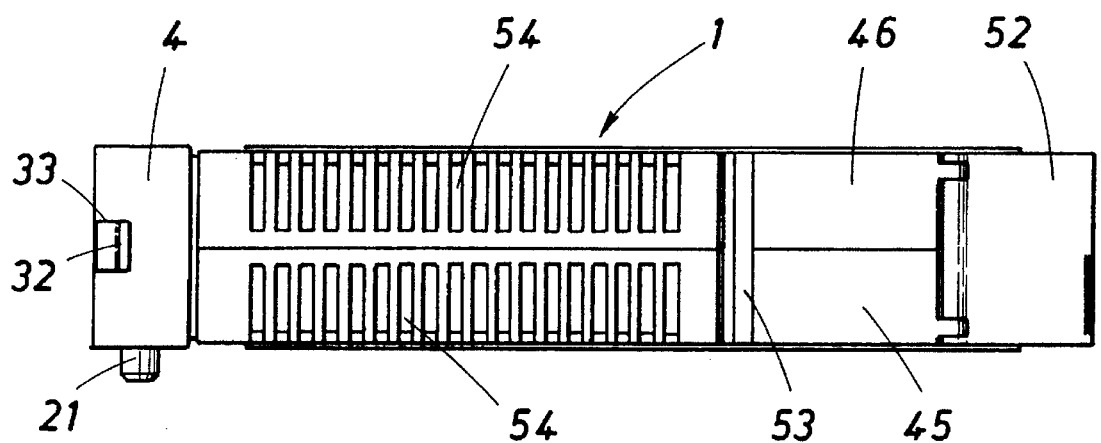
FIG. 7 is a top plan view related to FIG. 2.
Figure 9:
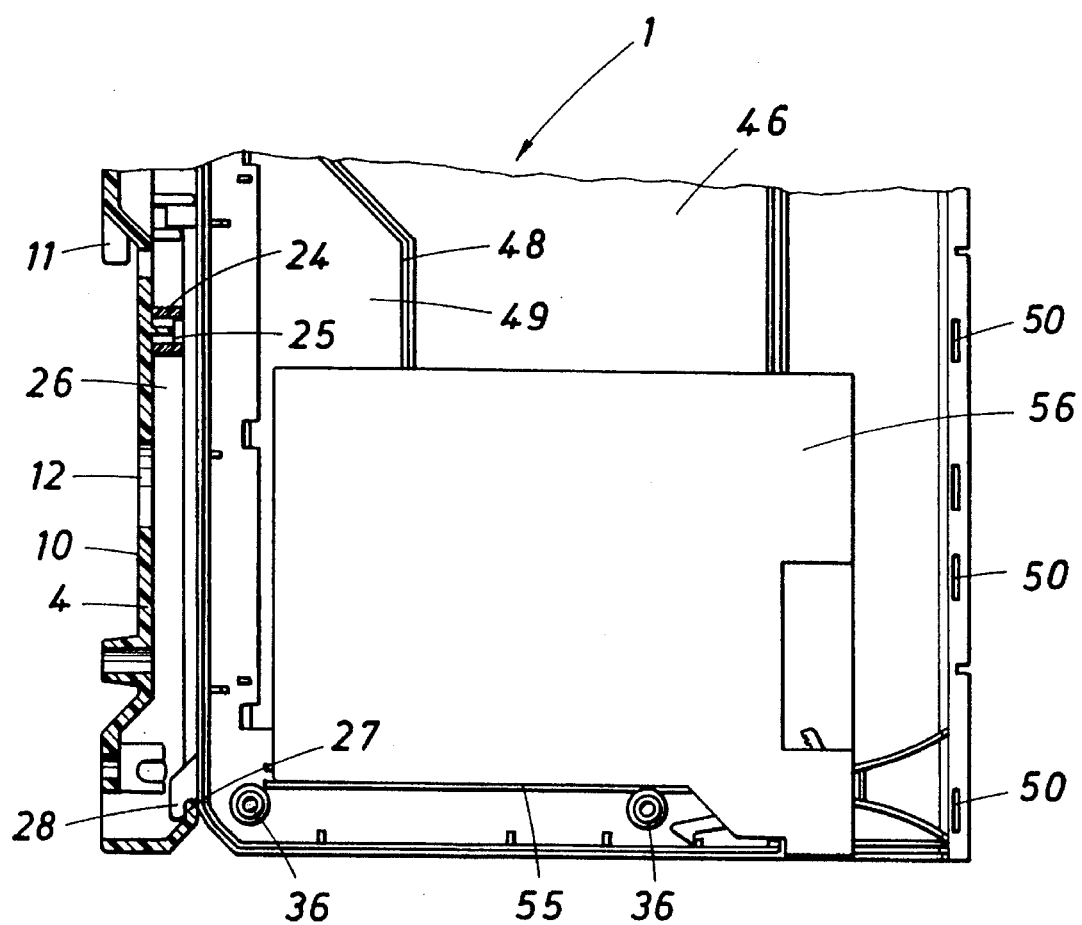
FIG. 9 is a longitudinal sectional view, which corresponds to the lower portion of FIG. 3 and illustrates a housing for a further component, which housing has been inserted into the module housing.

As shown in FIGS. 3, 7 and 9, the shell element 46 which constitutes one side wall of housing 1 or 2 is formed with an opening 48, through which the interior space of the housing is accessible and which can be closed by a hinged door 49. The door and the shell members are integrally formed with the hinge elements when they are made from plastic. Corresponding hinge elements 50 are integrally formed with a front door 51 (FIG. 1), through which the lower part of the housing 1 or 2 is accessible. Doors having different shapes may be used. The top part of the housings 1, 2 is provided in front with receptacles for inclined windows 52 and display means may be provided behind such windows. Slide tracks for indicating labels 53 are provided in the uppermost portion of the housing. The confronting shell walls and the top and bottom wall of the interposed piece 47 are shaped to constitute a ventilation grille 54. Besides, slide tracks 55 are provided on the shell members 45, 46 and on partition fragments in the interposed piece and, for instance, in the embodiment shown in FIG. 9 receive a slidably inserted module housing 56.

We claim:

1. A modular electrical control system comprising
   (a) individual subassembly housings juxtaposed in a row, at least one of the housings having a width differing from the width of the other housings, which width corresponds to a basic module dimension, and the differing width being an integral multiple of the basic module dimension,
   (b) plug terminals and counterplug terminals arranged on each subassembly housing for making electrical line connections,
   (c) rear wall elements having identical widths corresponding to the basic module dimension,
   (d) detachable retaining means for securing the subassembly housings on the rear wall elements, the retaining means comprising
      (1) respective retaining extensions and cooperating detents on the rear wall elements and on the subassembly housings for detachably securing the housings to the rear wall elements,
   (e) a profiled carrying rail whereon the rear wall elements are juxtaposed in a row, and
   (f) locking means holding the rear wall elements on the carrying rail, the locking means being adapted to be opened from a front side of the rear wall elements.

2. The modular electrical control system of claim 1, further comprising spring clips on the rear wall elements for joining adjacent ones of the rear wall elements, each spring clip being a plastic molding having spring legs protruding through lateral openings in the rear wall elements and being adapted to snap into associated lateral openings in the adjacent rear wall element and to be disengaged from the associated lateral openings by actuation from the front side.

3. The modular electrical control system of claim 1, wherein the carrying rail has a hat profile and two flanges extending therefrom, a rear side of each rear wall element defining a recess for receiving the carrying rail, and the locking means comprises hooks engaging one of the carrying rail flanges for hanging the rear wall elements on the one carrying rail flange and pivotal catches having a wedge surface for engaging the other carrying rail flange, the hooks and catches being mounted on the rear wall elements, and the rear wall elements being pivotally movable into a locking position when they are hung and the wedge surface of the catches clamping the other carrying rail flange in said locking position.

4. The modular electrical control system of claim 3, wherein the pivoted catch has a pivot extending to the front side of the rear wall element, the pivot being provided with a position indicator.

5. The modular electrical control system of claim 4, wherein the position indicator is a disk defining a receiving opening for an actuating implement for pivoting the catch from the front side of the rear wall element.

6. The modular electrical control system of claim 1, wherein the plug terminals are arranged at one side of the subassembly housings and the counterplug terminals are arranged at an opposite side thereof, the plug terminal on one of the rear wall elements cooperating with the counterplug terminal on an adjacent one of the rear wall elements.

7. The modular electrical control system of claim 1, wherein the one housing comprises two shell halves having a combined width corresponding to the basic module dimension and an interposed piece having a width corresponding to an integral multiple of the basic module dimension, and the other housings comprise two such shell halves.

8. The modular electrical control system of claim 7, wherein the housings define window openings at a front side thereof, and comprising doors or shutters selectively insertable therein.

9. The modular electrical control system of claim 7, comprising display windows selectively insertable in openings at a front side of the housings.

10. The modular electrical control system of claim 7, comprising slide tracks in the interior of the housings for inserting built-in elements in the housings.

* * * * *